(12) United States Patent
Zhang et al.

(10) Patent No.: US 12,316,103 B2
(45) Date of Patent: May 27, 2025

(54) ELECTROSTATIC DISCHARGE (ESD) PROTECTION CIRCUITS

(71) Applicants: Guobiao Zhang, Corvallis, OR (US); Zhitang Song, ShangHai (CN); Hongyu Yu, ShenZhen (CN); Sannian Song, ShangHai (CN)

(72) Inventors: Guobiao Zhang, Corvallis, OR (US); Zhitang Song, ShangHai (CN); Hongyu Yu, ShenZhen (CN); Sannian Song, ShangHai (CN)

(73) Assignee: Southern University of Science and Technology, GuangDong (CN)

( * ) Notice: Subject to any disclaimer, the term of this patent is extended or adjusted under 35 U.S.C. 154(b) by 0 days.

(21) Appl. No.: 18/381,237

(22) Filed: Oct. 18, 2023

(65) Prior Publication Data

US 2024/0047964 A1 Feb. 8, 2024

Related U.S. Application Data

(62) Division of application No. 17/721,312, filed on Apr. 14, 2022, now Pat. No. 11,824,347.

(30) Foreign Application Priority Data

Apr. 14, 2021 (CN) .......................... 202110402363.8
Jul. 23, 2021 (CN) .......................... 202110839110.7

(51) Int. Cl.
*H02H 9/02* (2006.01)
*H02H 9/00* (2006.01)
*H02H 9/04* (2006.01)
*H10D 89/60* (2025.01)

(52) U.S. Cl.
CPC .............. *H02H 9/005* (2013.01); *H02H 9/02* (2013.01); *H02H 9/046* (2013.01); *H10D 89/60* (2025.01)

(58) Field of Classification Search
CPC ..... H02H 9/00; H02H 9/04; H02H 9/046; H02H 9/005; H02H 9/02; H02H 9/044; H01L 27/0288; H01L 27/0248; H01L 27/0251; H01L 27/0266
USPC .......................................... 361/56, 91.1, 111
See application file for complete search history.

(56) References Cited

U.S. PATENT DOCUMENTS

| 6,583,972 B2 * | 6/2003 | Verhaege ............ H01L 27/0266 361/56 |
| 7,764,477 B2 | 7/2010 | Tang et al. |
| 10,388,561 B2 | 8/2019 | Hong |
| 2018/0096982 A1 * | 4/2018 | Schafer ............... H01L 27/0248 |

* cited by examiner

*Primary Examiner* — Danny Nguyen

(57) ABSTRACT

The present invention discloses an ESD protection circuit comprising resistor vias. It comprises a plurality of ESD devices connected in parallel, with each ESD device comprising a resistor and a two-terminal switch (e.g. an OTS component) connected in series. The resistor is formed in a resistor via disposed vertically with the two-terminal switch and filled with at least a conductive material with high resistivity.

4 Claims, 15 Drawing Sheets

Table 1. Compares the properties of various OTS materials

| | Te-based | | | Se-based | | S-based | O-based |
|---|---|---|---|---|---|---|---|
| | C-Te | Si-Te | B-Te | GeSeSbN | GeSeAs | Ge-S | Hf-O |
| $J_{on}$ (MA/cm$^2$) | 10 | 10 | 50 | 1 | 10 | 30 | 10 |
| Selectivity ($S=I_{ON}/I_{OFF}$) | $10^5$ | $10^6$ | $10^5$ | $10^7$ | $10^5$ | $10^6$ | $10^7$ |

ELECTROSTATIC DISCHARGE (ESD) PROTECTION CIRCUITS

CROSS-REFERENCE TO RELATED APPLICATIONS

This application is a divisional of U.S. patent application Ser. No. 17/721,312, filed on Apr. 14, 2022, which claims priorities from Chinese Patent Application No. 202110402363.8, filed Apr. 14, 2021; Chinese Patent Application No. 202110839110.7, filed Jul. 23, 2021, in the State Intellectual Property Office of the People's Republic of China (CN), the disclosure of which is incorporated herein by references in their entirety.

BACKGROUND

1. Technical Field of the Invention

The present invention relates to the field of integrated circuits, and more particularly to electrostatic discharge (ESD) protection circuits.

2. Prior Art

Electrostatic discharge (ESD) causes great challenges to the reliability of integrated circuits (IC's). FIG. 1 discloses an IC 00 which provides ESD protection to the circuit under protection (CUP) 20. A pad 10 is coupled with the CUP 20. Because the pad 10 may cause ESD, it is necessary to provide an ESD protection circuit 100 between the pad 10 and a power supply (e.g. ground or GND) 0. The ESD protection circuit 100 is coupled with the pad 10 through the first terminal 140, and with the power supply 0 through the second terminal 150.

The conventional ESD protection circuit 100 includes diode (e.g. Zener diode) and silicon-controlled rectifier (SCR). Its process is compatible with the CUP 20 and does not need extra processing steps. However, diode and SCR have limited conductivity: the largest current density they can conduct is $10^4$-$10^5$ A/cm$^2$. During an ESD event, the ESD protection circuit 100 for a single pad 10 needs to conduct at least one ampere of ESD current ($I_{ESD}$). To conduct a current of this magnitude, the conventional ESD protection circuit 100 needs to occupy at least 1,000-100,000 um$^2$ silicon area. This leads to two issues: 1) the large ESD area results in an extra die size. As an example, for an SoC, CPU or FPGA with hundreds of pads, ~20% of die area is the ESD protection circuits; 2) the large ESD area generates a large parasitic capacitance, which is unfriendly to a high-speed pin.

Ovonic threshold switch (OTS) can be used for the ESD protection circuit. FIG. 2 is an ESD protection circuit 100 based on an OTS component. It comprises a top electrode 110, a bottom electrode 120 and an OTS film 130 therebetween. The OTS film 130 comprises an OTS material, with a thickness of T and a dimension of D*. The top electrode 110 is coupled with the first terminal 140 (and further with the pad 10 in FIG. 1); and, the bottom electrode 120 is coupled with the second terminal 150 (and further with the power supply 0 in FIG. 1).

FIG. 3 shows the electrical (I-V) characteristics of an OTS component, which has both an OFF (high-impedance) state and an ON (low-impedance) state: for a positive scan (1→2), when the applied voltage (V) is greater than a threshold voltage $V_{th}$, the OTS component changes from the OFF state to the ON state, and a conduction current ($I_{ON}$) flows through; for a negative scan (3→4), when V is less than a hold voltage $V_{hold}$ (or, the current I is smaller than a hold current $I_{hold}$), the OTS component changes from the ON state to the OFF state. For the OTS component, its conduction current density ($J_{ON}$) is defined as $J_{ON}=I_{ON}/A_{OTS}$, where $A_{OTS}$ is the device area of the OTS component; and, its selectivity (S) is defined as: $S=I_{ON}/I_{OFF}$, where $I_{OFF}$ is the leakage current when $V=V_{th}/2$. FIG. 4 (Table 1) compares the properties of various OTS materials. The OTS materials generally contain chalcogen (Group 16) elements, such as Te (whose compound is telluride), Se (whose compound is selenide), S (whose compound is sulfide) and O (whose compound is oxide). Their $J_{ON}$ can reach or exceed 1 MA/cm$^2$, and selectivity can reach or exceed $10^5$. As a result, the ESD protection circuits based on OTS components can reduce the ESD area by a factor of 10-100. Furthermore, since the OTS component does not occupy any silicon area, this will further reduce the die area.

U.S. Pat. No. 7,764,477 B2 issued to Tang et al. on Jul. 27, 2010 (hereinafter Tang) discloses an ESD protection circuit based on an OTS component. It contains a smaller number (e.g. four, see FIG. 1 of Tang) of OTS components, which are not connected in parallel. Each OTS component needs to conduct substantial ESD current. Tang does not realize that the ON state of the OTS component has a nonlinear area effect, i.e. $I_{ON}$ is not proportional to the device area (see FIG. 5 in this specification and its description). A single OTS component with a large area cannot safely conduct the whole $I_{ESD}$. During an ESD event, the OTS component may fail.

To provide ESD protection for IC's with large supply voltages (i.e. large-supply IC, whose supply voltage $V_S$ is greater than $V_{th}$), several OTS components can be connected in series. For example, when $V_S=1.8V$, three OTS components with $V_{th}=0.6V$ each can be connected in series. U.S. Pat. No. 10,388,561 B2 issued to Hong on Aug. 20, 2019 (hereinafter Hong) discloses an ESD protection circuit using vertically-stacked OTS components. To be more specific, three OTS components 121, 122, 123 are vertically stacked and connected in series. Each of them is located on different levels (FIG. 4 of Hong). Since it needs three extra processing steps, this structure has a high manufacturing cost.

Neither Tang nor Hong takes into account that an IC may have multiple power supplies (e.g. 3.3V, 1.8V, 1.2V). These IC's are referred to as multi-supply IC's. In the multi-supply IC's, prior art uses different ESD protection circuits for different supply voltages, which increases manufacturing costs.

Objects and Advantages

It is a principle object of the present invention to reduce the area of the ESD protection circuits.

It is a further object of the present invention to minimize the extra die area from the ESD protection circuits.

It is a further object of the present invention to minimize the parasitic capacitance from the ESD protection circuits.

It is a further object of the present invention to prevent thermal runaway in the ESD protection circuits.

It is a further object of the present invention to minimize the non-linear area effect of the OTS components.

It is a further object of the present invention to lower the ESD cost for the large-supply IC's.

It is a further object of the present invention to provide ESD protection for the multi-supply IC's.

It is a further object of the present invention to lower the ESD cost for the multi-supply IC's.

In accordance with these and other objects of the present invention, the present invention discloses several ESD protection circuits.

SUMMARY OF THE INVENTION

The present invention discloses a parallel ESD protection circuit. An OTS component has a nonlinear area effect in its ON state. As illustrated in FIG. 5, for two OTS components with different areas (A1=30 nm*30 nm, A2=100 nm*100 nm), $I_{OFF}$ is proportional to $A_{OTS}$ at the OFF state; however, $I_{ON}$ is not proportional to $A_{OTS}$ at the ON state. This is because the conduction in the OFF state is areal conduction, whereas the conduction in the ON state is local conduction (or point conduction), not areal conduction. When transitioning from the OFF state to the ON state, not all OTS materials on the entire contact surface between the OTS film and the electrodes are converted to a low-impedance state, but only the OTS material near one (or a few) points is converted to a low-impedance state. These points are referred to as conductive filaments. Therefore, if the ESD protection circuit contains only one (or a small number of) large-area (whose device area is tens of microns or more) OTS components, although each OTS components seems large, it can only form a small number of conductive filaments at an ESD event. As a result, each conductive filament still needs to conduct a large current, which can cause the OTS material near the conductive filaments to be thermally damaged.

To avoid thermal runaway, an ESD protection circuit preferably comprises a large number of parallel-connected, small-area (whose device area ranges from tens of nanometers to several microns) OTS components. During an ESD event, $I_{ESD}$ can be dispersed across this large number of OTS components. Since each OTS component conducts a relatively small current, no thermal runaway occurs. It is known that $V_{th}$ of the OTS components has a statistical distribution. As disclosed in FIG. 6, the average $V_{th}$ is $V_{th,0}$, and its standard deviation is $V_{delta}$ (as an example, typical $V_{delta}$~0.1V). In order to activate all OTS components at an ESD event (i.e. to ensure that each OTS component is turned on), it is necessary to connect each OTS component in series with a resistor (i.e. a series resistor), which will generate a voltage drop $V_R$ greater than $V_{delta}$ at the ESD event. To be more specific, $V_R=k*V_{delta}$, k>1 and preferably >2. Even in the worst case, the voltage applied to each OTS component will be greater than its $V_{th}$. As a result, all OTS components will be activated at an ESD event and conduct the ESD current. Since the ESD current conducted through each OTS component is relatively small, there will be no thermal runaway.

Accordingly, the present invention discloses a parallel ESD protection circuit having a first terminal coupled with a pad and a second terminal coupled with a power supply, comprising a plurality of ESD devices connected in parallel, wherein: each of said ESD devices have first and second sub-terminals, wherein the first sub-terminals of all of said ESD devices are coupled with said first terminal, and the second sub-terminals of all of said ESD devices are coupled with said second terminal; each of said ESD devices comprises a resistor and an OTS component, wherein said resistor and said OTS component are connected in series; whereby said ESD protection circuit provides ESD protection for said pad.

For practical designs, to increase the number of the parallel-connected ESD devices, the dimension D of the OTS component is generally smaller than 10 um, preferably smaller than 1 um, such as 0.2 um or 60 nm. At an ESD event, it is necessary to generate a voltage drop $V_R > V_{delta}$ on the series resistor ($V_R > V_{delta}$, preferably $> 2*V_{delta}$). As an example, an OTS component with D=60 nm can conduct 5 mA current. In order to generate $V_R > 2*V_{delta} = 0.2V$, the resistance of the series resistor is preferably greater than 40 Ohm. In general, the resistance of the series resistor is preferably greater than 10 Ohm. Moreover, in order to save die area, the series resistor is preferably formed in a resistor via. The resistivity of the conductive material in the resistor via is generally greater than 10 micro-Ohm*cm (i.e. 1 E-7 Ohm*m), preferably greater than 100 micro-Ohm*cm (i.e. 1 E-6 Ohm*m). In a preferred embodiment, the resistivity of the conductive material in the resistor via may reach 1000 micro-Ohm*cm (i.e. 1 E-5 Ohm*m).

To lower the ESD cost for the large-supply IC's ($V_S > V_{th}$), the ESD protection circuit preferably uses a plurality of series-connected, laterally-placed OTS components: all OTS components are disposed on a same level and therefore, manufactured simultaneously. They are laterally connected in series through vertical vias and horizontal interconnects.

Accordingly, the present invention discloses a series ESD protection circuit having a first terminal coupled with a pad and a second terminal coupled with a power supply, comprising first and second ESD devices connected in series, wherein: said first ESD device has first and second sub-terminals, said second ESD device has third and fourth sub-terminals, wherein the first sub-terminal is coupled with said first terminal, said second sub-terminal is coupled with said third sub-terminal, said fourth sub-terminal is coupled with said second terminal; said first ESD device comprises a first OTS component, said second ESD device comprises a second OTS component, wherein said first and second OTS components are disposed on a same level; whereby said ESD protection circuit provides ESD protection for said pad.

The series ESD protection circuits are particularly suitable for multi-supply IC's. Accordingly, the present invention discloses a multi-supply integrated circuit having first and second supply voltages $V_S$, $V_S'$, comprising: a first ESD protection circuit for said first supply voltage $V_S$, wherein said first ESD protection circuit comprises m ESD devices connected in series; a second ESD protection circuit for said second supply voltage $V_S'$, wherein said second ESD protection circuit comprises n ESD devices connected in series; wherein, m and n are positive integers greater than 1 and have different values; at least a first ESD device in said first ESD protection circuit and at least a second ESD device in said second ESD protection circuit have a same structure.

To avoid thermal runaway while lowering the ESD cost for a large-supply IC, it is often necessary to combine the parallel and series ESD protection circuits. Accordingly, the present invention discloses a hybrid ESD protection circuit, comprising: first and second ESD groups, each of said first and second ESD group comprising a plurality of ESD devices; wherein said ESD protection circuit is in either one of two configurations: (1) said first and second ESD groups are connected in parallel and said ESD devices in either of said first and second ESD groups are connected in series; or, (2) said first and second ESD groups are connected in series and said ESD devices in either of said first and second ESD groups are connected in parallel.

To be more specific, the present invention discloses a series-parallel ESD protection circuit, comprising: a first ESD group comprising a first plurality of ESD devices connected in series; a second ESD group comprising a second plurality of ESD devices connected in series;

wherein, said first and second ESD groups are connected in parallel; each of said ESD devices comprises an OTS component.

In addition, the present invention also discloses a parallel-series ESD protection circuit, comprising: a third ESD group comprising a third plurality of ESD devices connected in parallel; a fourth ESD group comprising a fourth plurality of ESD devices connected in parallel; wherein, said third and fourth ESD groups are connected in series; each of said ESD devices comprises an OTS component.

Figure 1:
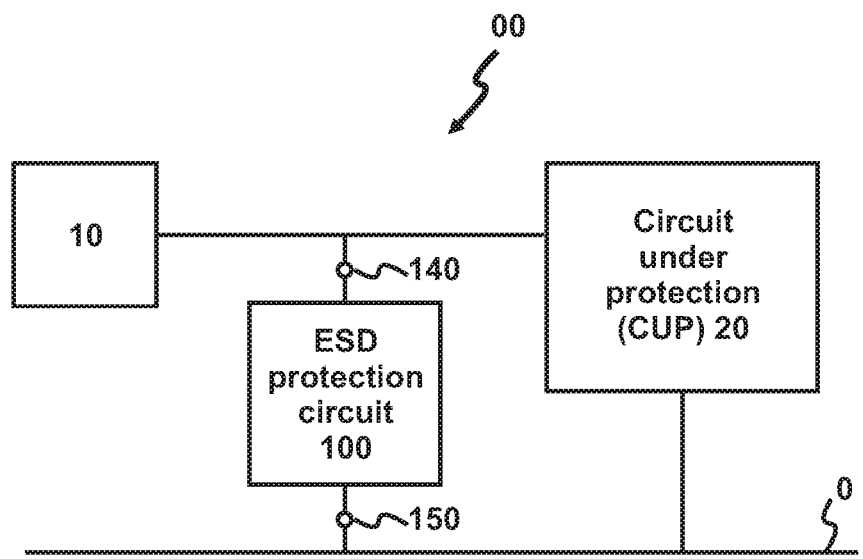
FIG. 1 is an integrated circuit (IC) containing an ESD protection circuit.
Figure 2:
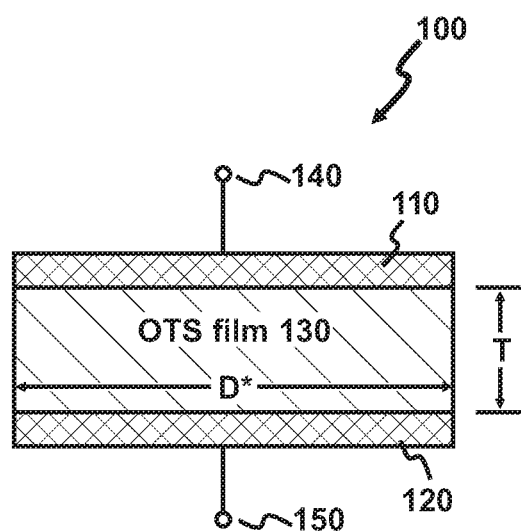
FIG. 2 is a cross-sectional view of an ESD protection circuit using an OTS component (prior art)
Figures 3, 4:
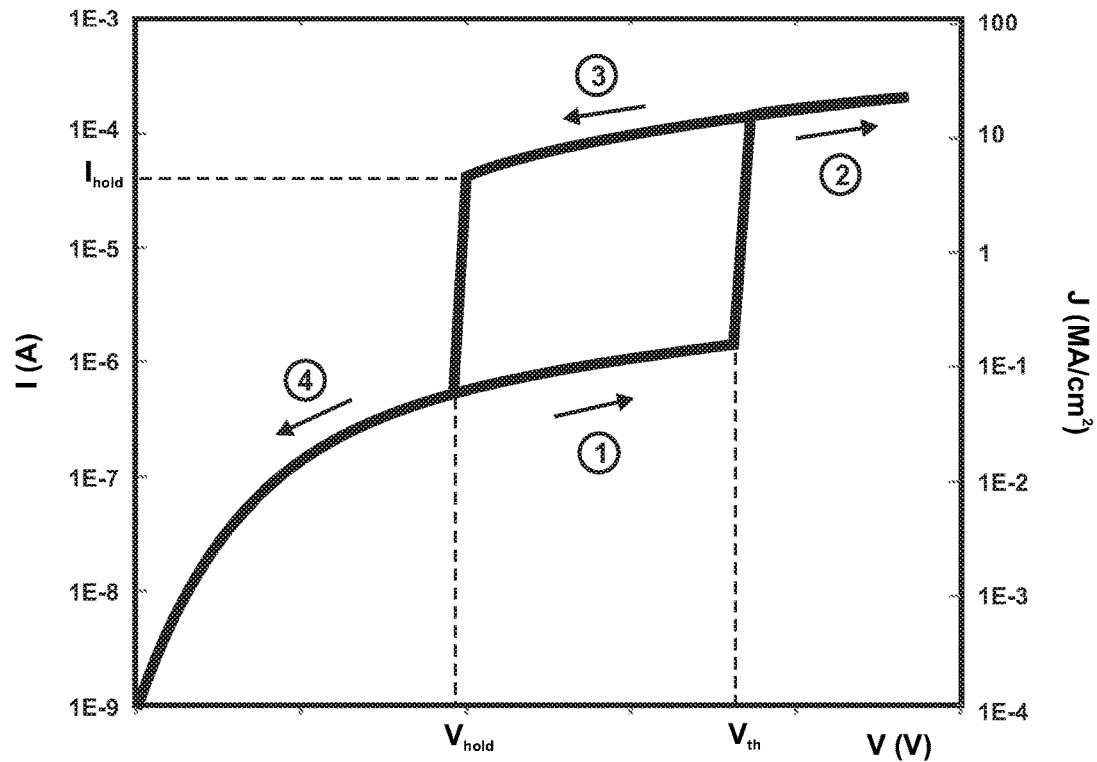
FIG. 3 illustrates the electrical (I-V) characteristics of a typical OTS component.
FIG. 4 (Table 1) compares the properties of various OTS materials.

It should be noted that all the drawings are schematic and not drawn to scale. Relative dimensions and proportions of parts of the device structures in the figure have been shown exaggerated or reduced in size for the sake of clarity and convenience in the drawings. The same reference symbols are generally used to refer to corresponding or similar features in the different embodiments. The symbol "/" means a relationship of "and" or "or".

The ESD protection circuit 100 disclosed in the present invention may be integrated in a die containing the circuit under protection (CUP), or used as a separation component (i.e., separated from the die containing the CUP). FIGS. 8A-9B show the substrate OX. If the ESD protection circuit 100 is integrated in the same die as the CUP, the substrate OX is the CUP's substrate; if the ESD protection circuit 100 is a separate component, the substrate OX is the substrate of the ESD protection circuit 100. For the sake of simplicity, substrate is not shown in other figures. In this specification, the positional relationship between "up" and "down" is relative to the substrate of the ESD protection circuit 100.

DETAILED DESCRIPTION OF THE PREFERRED EMBODIMENTS

Those of ordinary skills in the art will realize that the following description of the present invention is illustrative only and is not intended to be in any way limiting. Other embodiments of the invention will readily suggest themselves to such skilled persons from an examination of the within disclosure.

Figure 5:
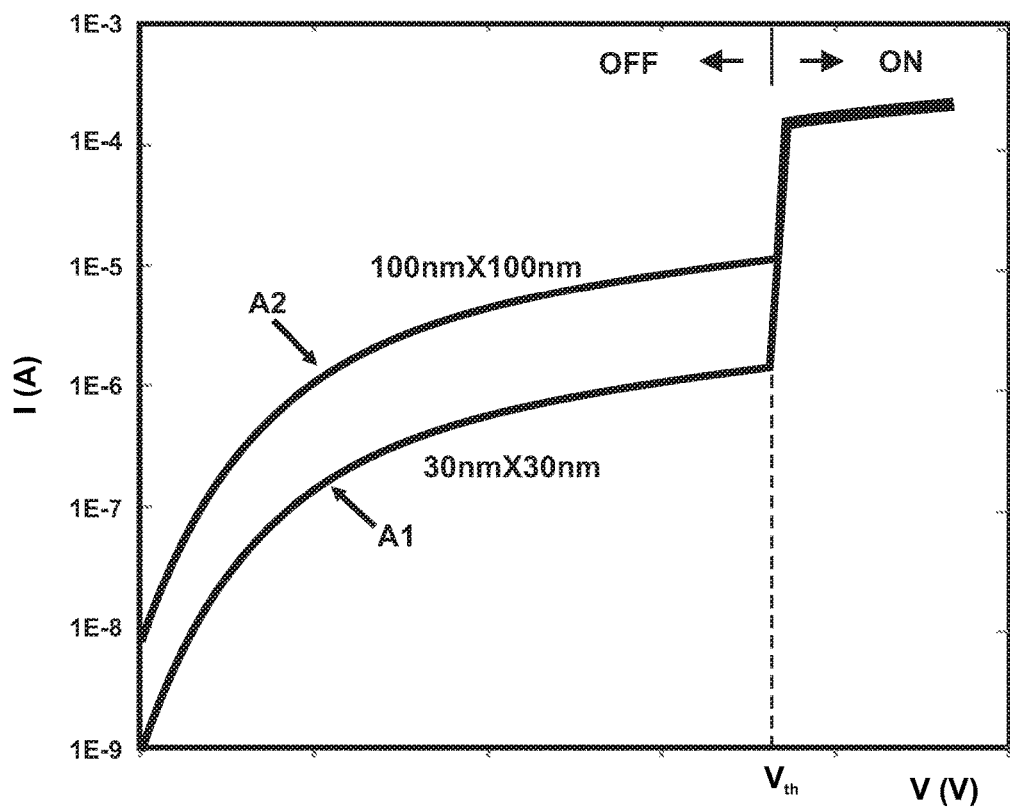
FIG. 5 compares the electrical characteristics of two OTS components with different device areas (A1=30 nm*30 nm, A2=100 nm*100 nm).

The present invention discloses a parallel ESD protection circuit. An OTS component has a nonlinear area effect in its ON state. As illustrated in FIG. 5, for two OTS components with different areas (A1=30 nm*30 nm, A2=100 nm*100 nm), $I_{OFF}$ is proportional to $A_{OTS}$ at the OFF state; however, $I_{ON}$ is not proportional to $A_{OTS}$ at the ON state. This is because the conduction in the OFF state is areal conduction, whereas the conduction in the ON state is local conduction (or point conduction), not areal conduction. When transitioning from the OFF state to the ON state, not all OTS materials on the entire contact surface between the OTS film and the electrodes are converted to a low-impedance state, but only the OTS material near one (or a few) points is converted to a low-impedance state. These points are referred to as conductive filaments. Therefore, if the ESD protection circuit contains only one (or a small number of) large-area (whose device area is tens of microns or more) OTS components, although each OTS components seems large, it can only form a small number of conductive filaments at an ESD event. As a result, each conductive filament still needs to conduct a large current, which can cause the OTS material near the conductive filaments to be thermally damaged.

Figure 6:
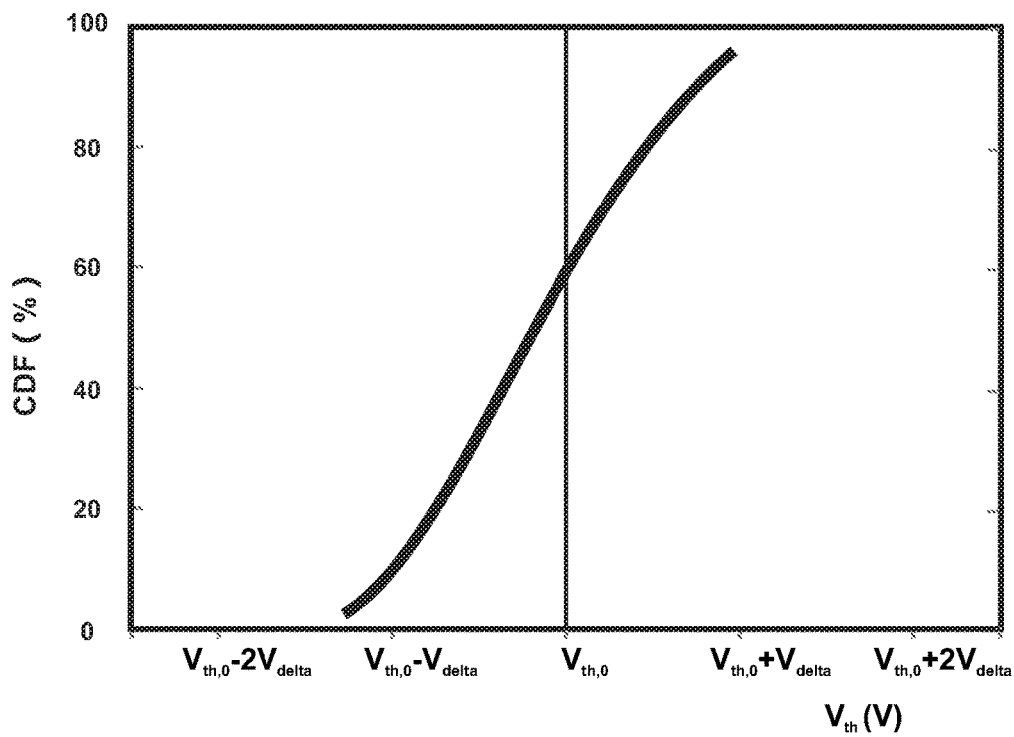
FIG. 6 illustrates a cumulative distribution function (CDF) of $V_{th}$'s for all OTS components on a wafer.

To avoid thermal runaway, an ESD protection circuit preferably comprises a large number of parallel-connected, small-area (whose device area ranges from tens of nanometers to several microns) of OTS components. During an ESD event, $I_{ESD}$ can be dispersed across this large number of OTS components. Since each OTS component conducts a relatively small current, no thermal runaway occurs. It is known that $V_{th}$ of the OTS components has a statistical distribution. As disclosed in FIG. 6, the average $V_{th}$ is $V_{th,0}$, and its standard deviation is $V_{delta}$ (as an example, typical $V_{delta} \sim 0.1$ V). In order to activate all OTS components at an ESD event (i.e. to ensure that each OTS component is turned on), it is necessary to connect each OTS component in series with a resistor (i.e. a series resistor), which will generate a voltage drop $V_R$ greater than $V_{delta}$ at the ESD event. To be more specific, $V_R = k*V_{delta}$, $k>1$ and preferably >2. Even in the worst case, the voltage applied to each OTS component will be greater than its $V_{th}$. As a result, all OTS components will be activated at an ESD event and conduct the ESD current. Since the ESD current conducted through each OTS component is relatively small, there will be no thermal runaway.

For practical designs, to increase the number of the parallel-connected ESD devices, the dimension D of the OTS component is generally less than 10 micrometers (um), preferably less than 1 um, such as 0.2 um or 60 nm. At an ESD event, it is necessary to generate a voltage drop $V_R$ larger than $V_{delta}$ on the series resistor ($V_R > V_{delta}$, preferably $>2$ $V_{delta}$). As an example, an OTS component with D=60 nm can conduct 5 mA current. In order to generate $V_R > 2V_{delta} = 0.2V$, the resistance of the series resistor is preferably greater than 40 Ohm. In general, the resistance of the series resistor is preferably greater than 10 Ohm. Moreover, in order to save die area, the series resistor is preferably formed in a resistor via. The resistivity of the conductive material in the resistor via is generally greater than 10 micro-Ohm*cm (i.e. 1 E-7 Ohm*m), preferably greater than 100 micro-Ohm*cm (i.e. 1 E-6 Ohm*m). In a preferred embodiment, the resistivity of the conductive material in the resistor via may reach 1000 micro-Ohm*cm (i.e. 1 E-5 Ohm*m).

Figure 7A:
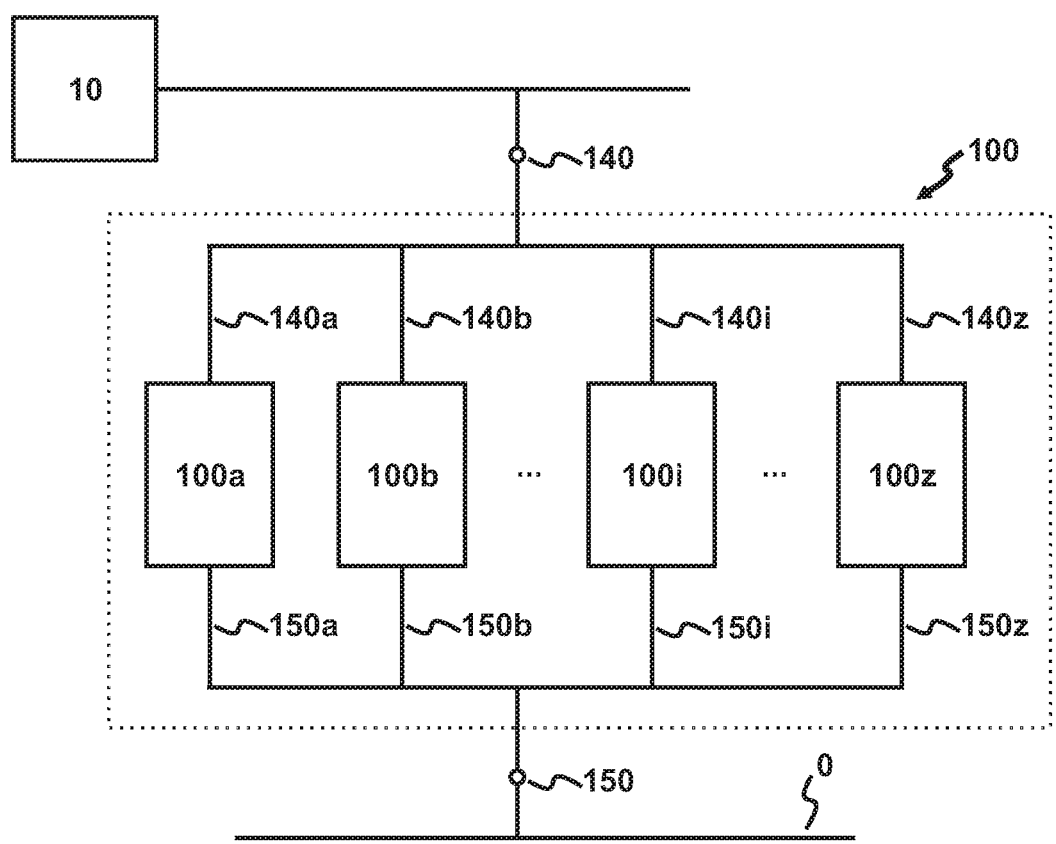
FIG. 7A illustrates a circuit diagram of a preferred parallel ESD protection circuit.
Figure 7B:
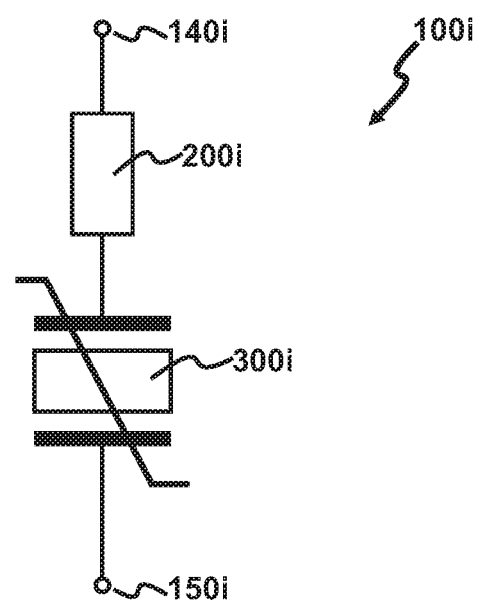
FIG. 7B is a circuit diagram of a preferred ESD device.

FIGS. 7A-7B disclose a preferred parallel ESD protection circuit 100. The preferred ESD protection circuit 100 is coupled with the pad 10 and the power supply 0. It comprises a plurality of parallel-connected ESD devices 100A, 100b . . . 100i . . . 100z (FIG. 7A). Each ESD device 100i comprises a first sub-terminal 140i and a second sub-terminal 150i (FIG. 7B). The first sub-terminals 140a, 140b . . . 140i . . . 140z of these ESD devices 100a, 100b . . . 100i . . . 100z are connected with the first terminal 140 of the ESD protection circuit 100, and the second sub-terminals 150a, 150b . . . 150i . . . 150z are connected with the second terminal 150 of the ESD protection circuit 100 (FIG. 7A). In order to activate all OTS components and prevent thermal runaway at an ESD event, the ESD device 100i comprises a resistor (i.e. a series resistor) 200i and an OTS component 300i connected in series (FIG. 7B). At an ESD event, the voltage drop on each ESD device 100i is same, and the series resistor 200i in each ESD device 100i flows a same current as the OTS component 300i, while a voltage drop $V_R$ ($>V_{delta}$) is generated on the series resistor 200i.

Figure 8A:
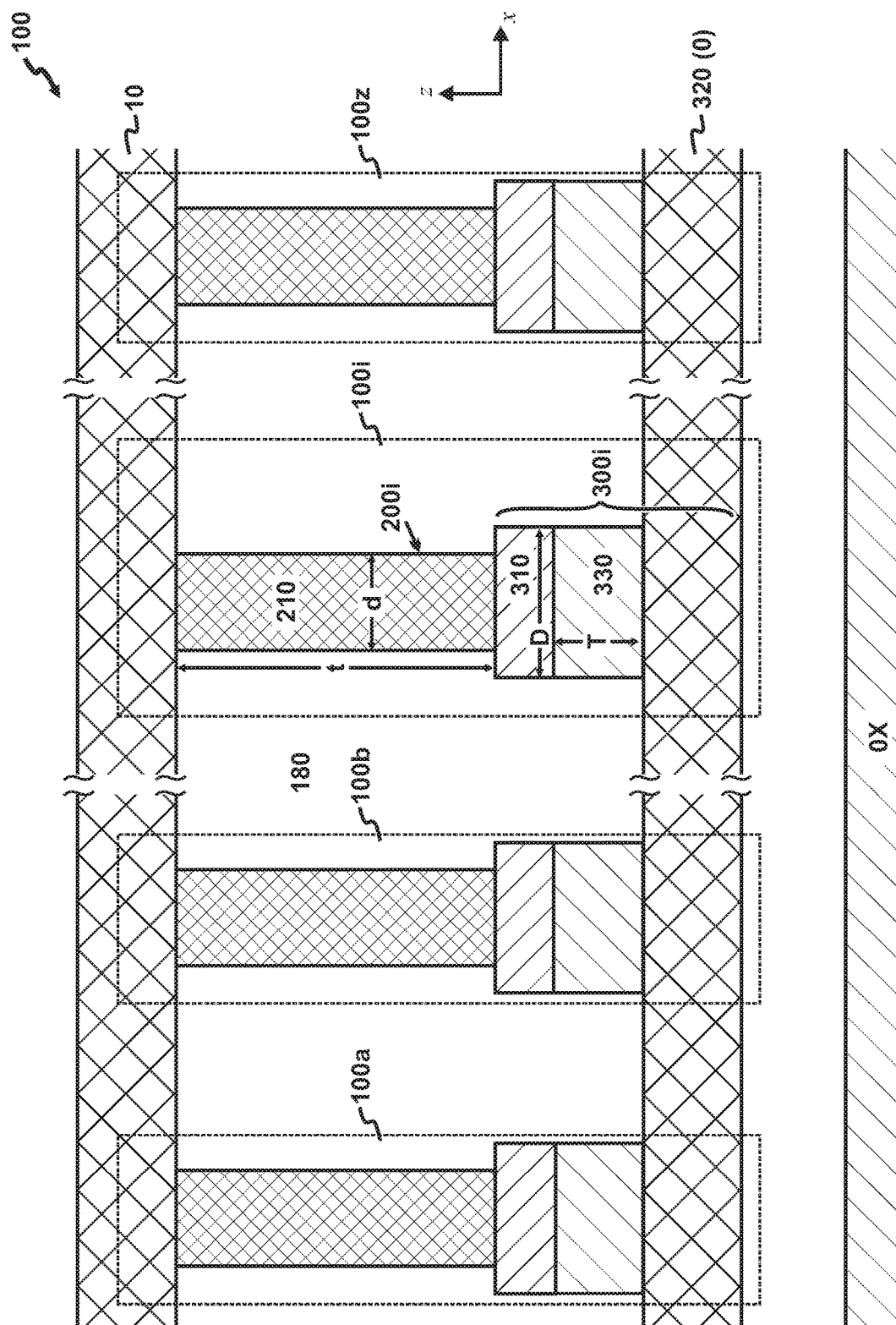
FIGS. 8A-8C are cross-sectional views of three preferred type-I parallel ESD protection circuits.
Figure 8B:
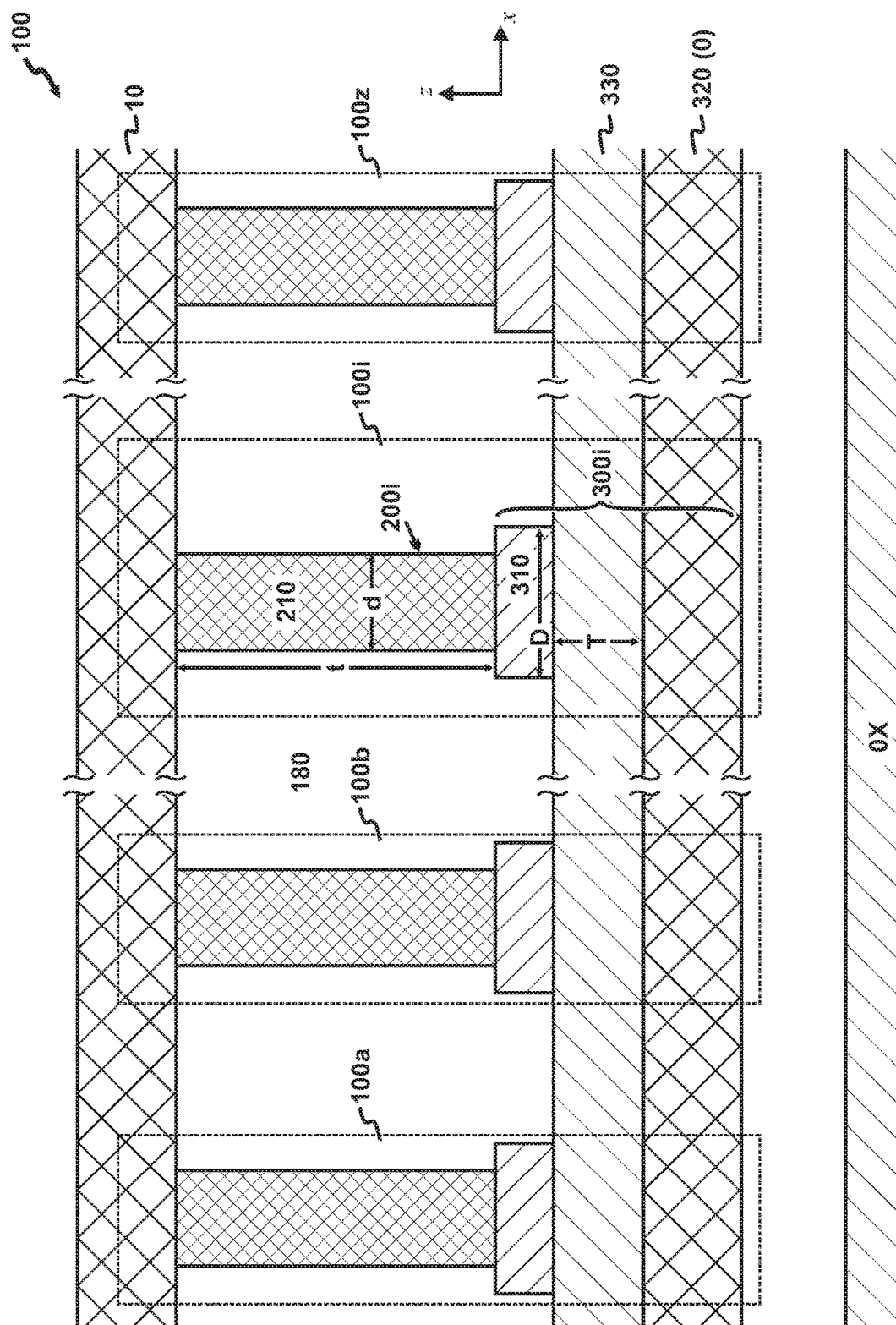
Figure 8C:
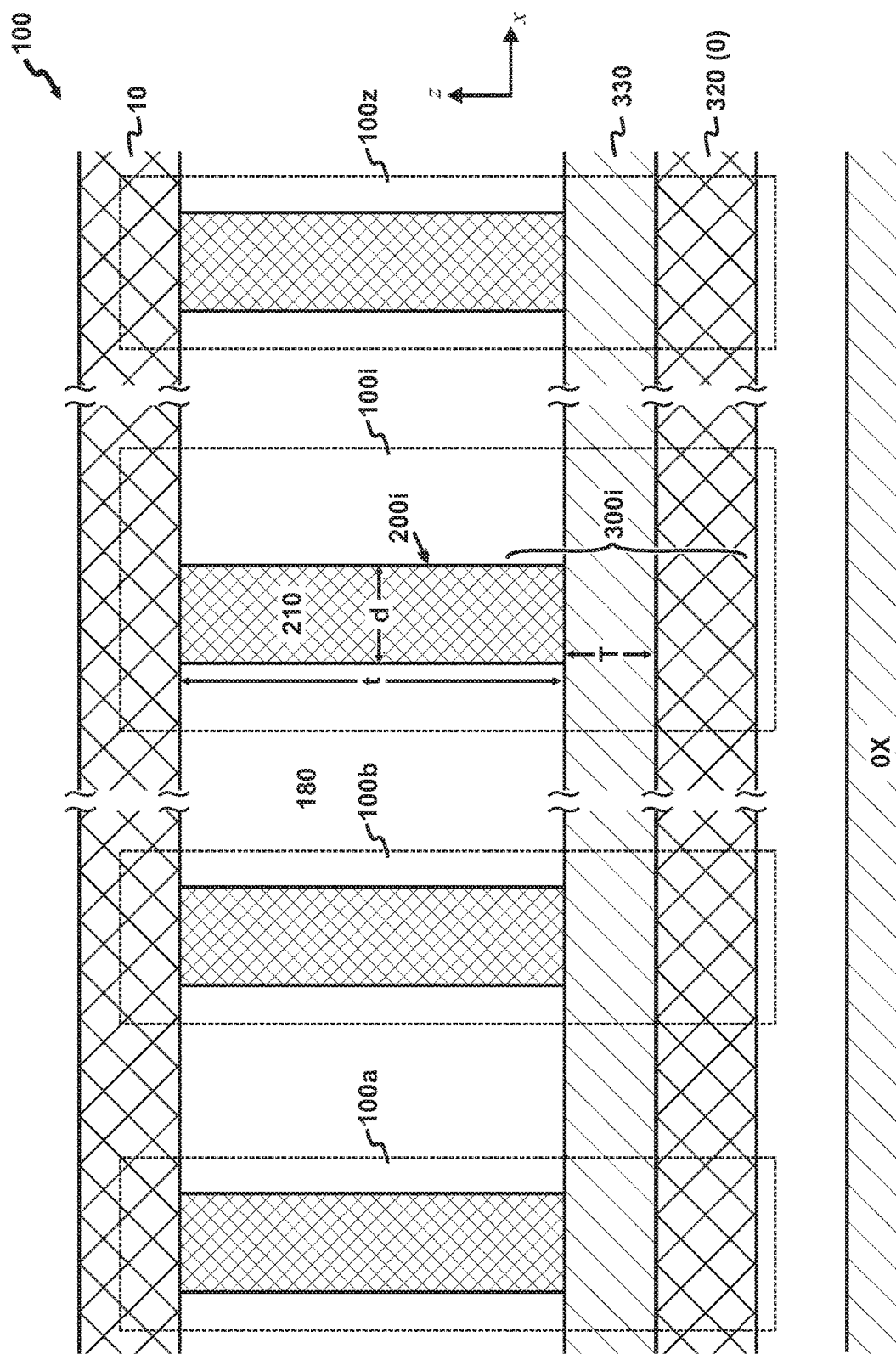

FIGS. 8A-8C disclose three preferred type-I parallel ESD protection circuits 100, which correspond to the circuits in FIGS. 7A-7B. In the preferred type-I ESD protection circuit 100, the series resistor 200i is disposed above the OTS component 300i. The OTS component 300i comprises an upper electrode 310, a lower electrode 320, and an OTS film 330 therebetween. The dimension of OTS component 300i is D. In order to prevent the ON-state nonlinear area effect, it is preferred to use small-area OTS components 300i. To be more specific, D is smaller than 10 um, preferably smaller than 1 um, such as 0.2 um or In other words, D ranges from tens of nanometers to microns.

In order to save the die area, the series resistor is preferably formed in a resistor via. To be more specific, an inter-layer dielectric 180 is disposed between the upper electrode 310 and the pad 10. A plurality of the resistor vias 210 are formed in the inter-layer dielectric 180. The series resistor 200i is formed in the resistor via 210, which is filled with conductive material. The dimension of the resistor via 210 is d and the height is t. In order to generate a large voltage drop $V_R$ ($>V_{delta}$, preferably $>2*V_{delta}$) in the resistor via 210 at the ESD event, the resistor via 210 needs to be filled with conductive materials with high resistivity, whose resistivity is generally larger than 10 micro-Ohm*cm (i.e. 1 E-7 Ohm*m), preferably larger than 100 micro-Ohm*cm (i.e. 1 E-6 Ohm*m). As an example, the high-resistivity materials can be titanium nitride (TiN, whose resistivity is 150 micro-ohm*cm), etc. In order to further increase resistivity, a small amount of oxygen, nitrogen or other non-metallic elements can be doped (e.g., implanted) into the metallic materials in the resistor via 210.

For the embodiment of FIG. 8A, the OTS film 330 is etched during the etching step of the upper electrode 310 and this etching step stops on the upper surface of the lower electrode 320. For the embodiment of FIG. 8B, the step of etching the upper electrode 310 stops on the upper surface of the OTS film 330. For the embodiment of FIG. 8C, the OTS component 330i does not have a separate upper electrode 310, and the resistor via 210 is in direct contact with the OTS film 330. For this embodiment, the dimension D of the OTS component 300i is equal to the dimension d of the resistor via 210.

Figure 9A:
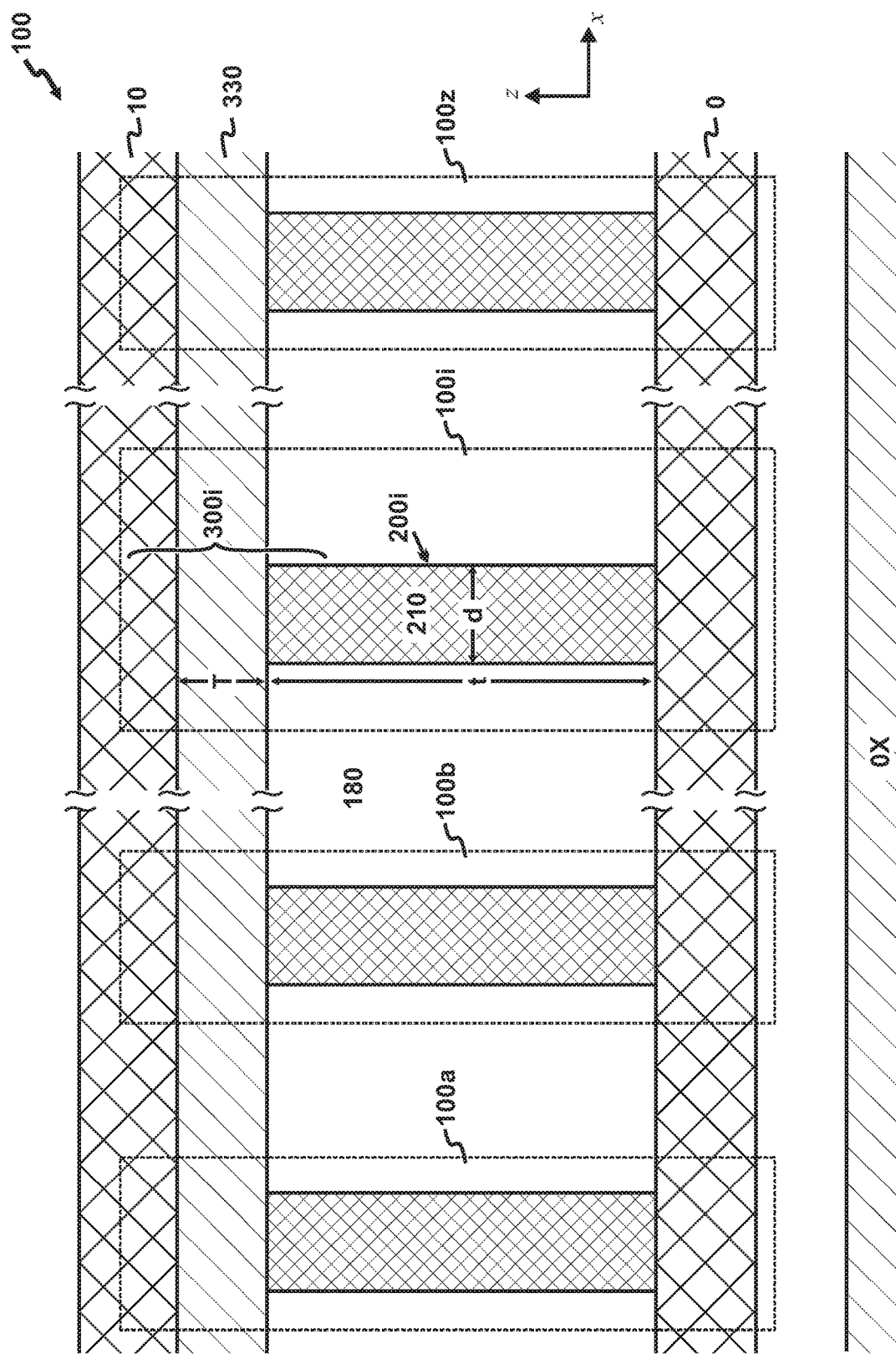
FIGS. 9A-9B are cross-sectional views of two preferred type-II parallel ESD protection circuits.
Figure 9B:
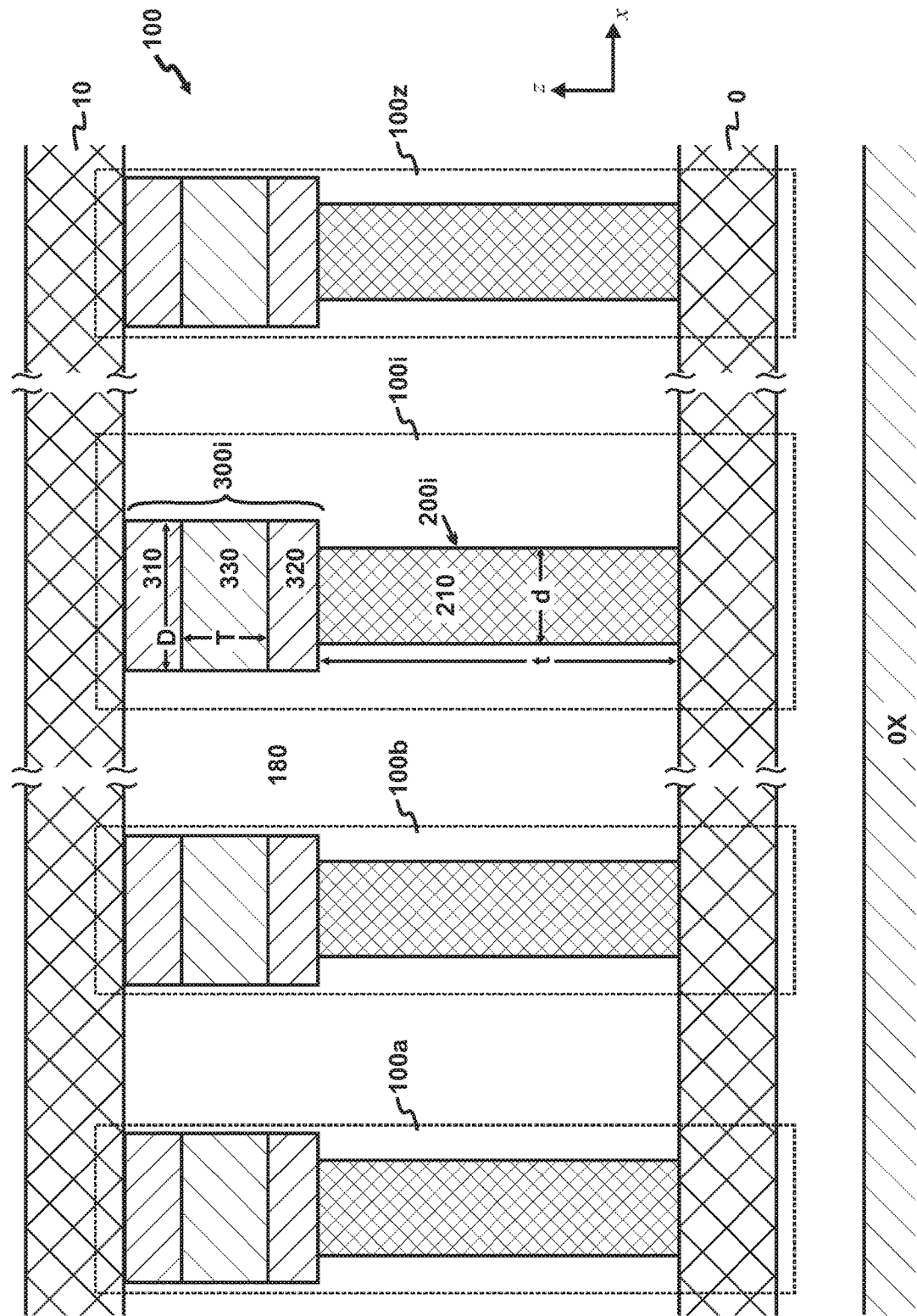

FIGS. 9A-9B disclose two type-II parallel ESD protection circuits 100. In the type-II ESD protection circuits 100, the series resistor 200i is disposed below the OTS component 300i. Specifically, the series resistor 200i is formed in the resistor via 210 first. Then the inter-layer dielectric 180 is planarized and the OTS component 300i is formed thereon. For the embodiment of FIG. 9A, the OTS material 330 is formed directly on the resistor via 210. For the embodiment of FIG. 9B, a complete OTS component 300i (including an upper electrode 310, a lower electrode 320 and an OTS film 330) is formed on the resistor via 210.

To lower the ESD cost for the large-supply IC's ($V_S>V_{th}$), the ESD protection circuit preferably uses a plurality of series-connected, laterally-placed OTS components: all OTS components are disposed on a same level and therefore, manufactured simultaneously. They are laterally connected in series through vertical vias and horizontal interconnects.

Figure 10:
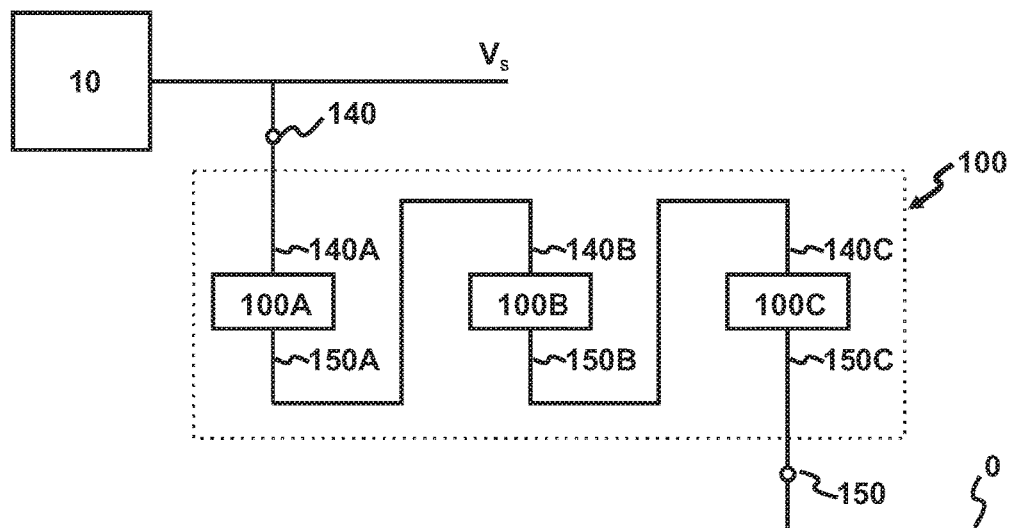
FIG. 10 is a circuit diagram of a preferred series ESD protection circuit.

As illustrated in FIG. 10, a preferred series ESD protection circuit 100 comprises three ESD devices 100A, 100B, 100C connected in series. Each ESD device (e.g. 100A) has first and second sub-terminals (e.g. 140A, 150A). The pad 10 is connected with the first terminal 140 of the ESD protection circuit 100. The first sub-terminal 140A of the ESD device 100A is connected with the first terminal 140 of the ESD protection circuit 100. The second sub-terminal 150A of the ESD device 100A is connected with the first sub-terminal 140B of the ESD device 100B. The second sub-terminal 150B of the ESD device 100B is connected with the first sub-terminal 140C of the ESD device 100C. The second sub-terminal 150C of the ESD device 100C is connected with the second terminal 150 of the ESD protection circuit 100. The second terminal 150 of the ESD protection circuit 100 is connected to the power supply 0. In an ESD event, the ESD devices 100A, 100B, 100C flow a same current.

Figure 11A:
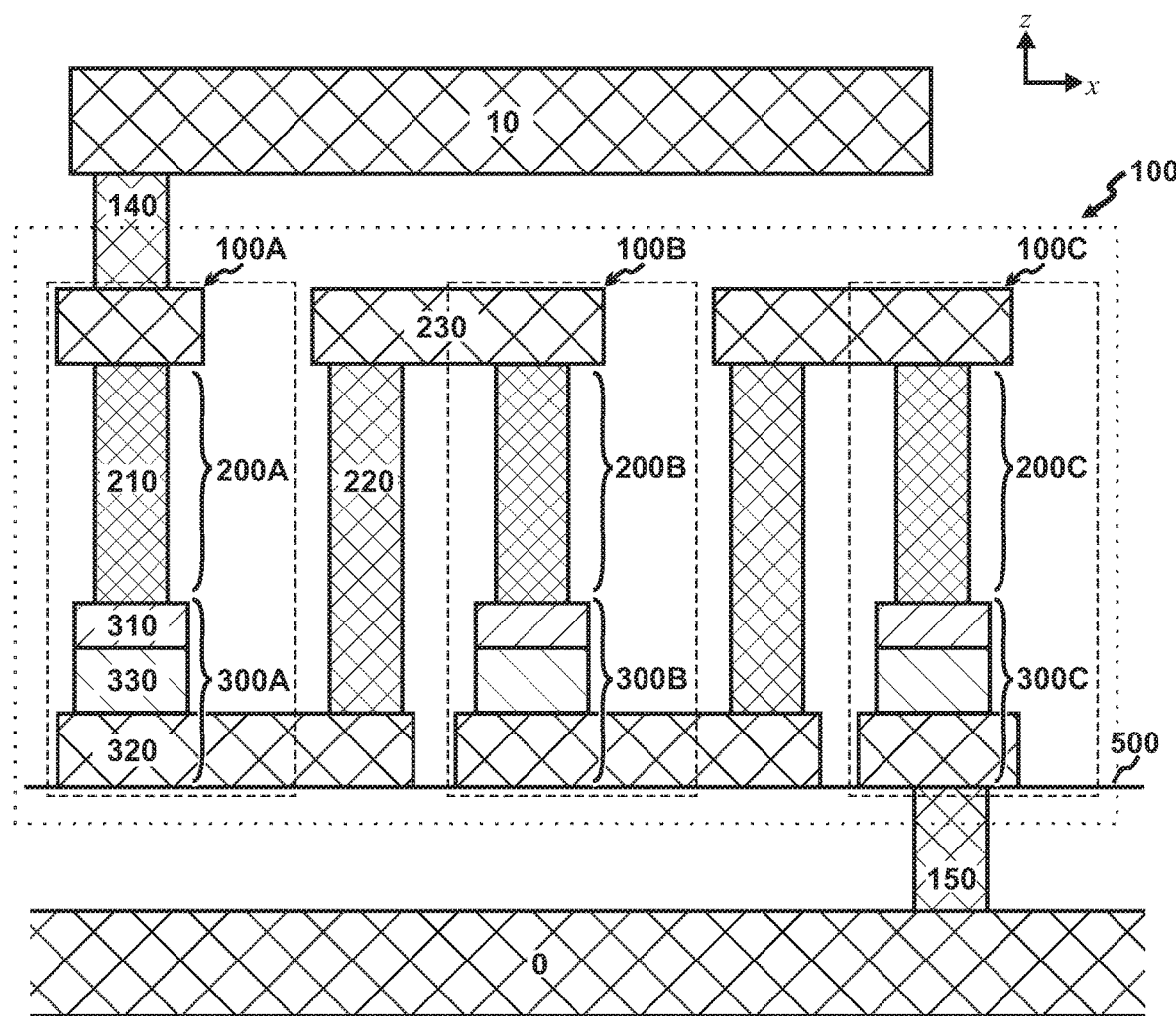
FIGS. 11A-11B are cross-sectional views of two preferred series ESD protection circuits.
Figure 11B:
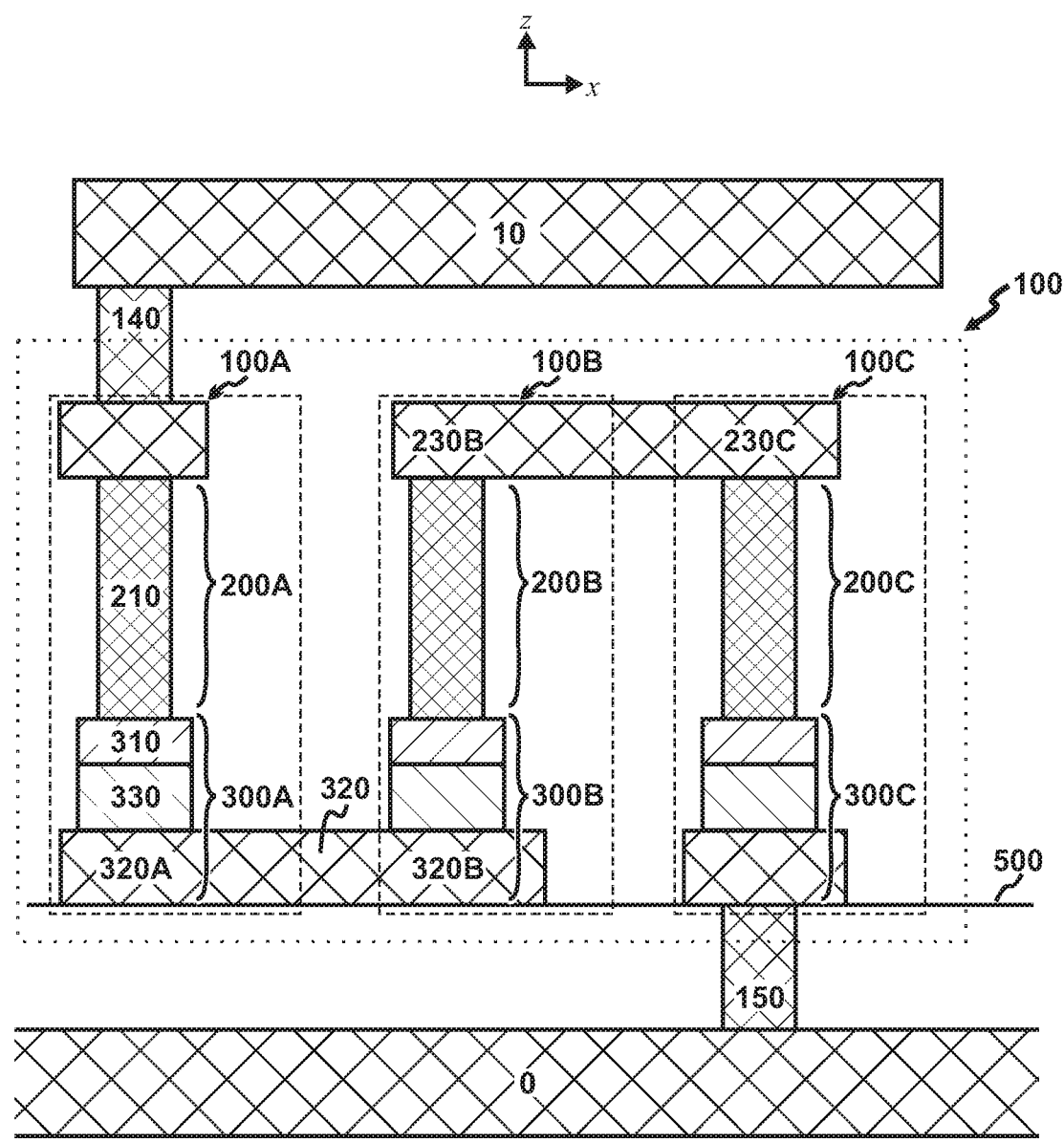

A detailed structure of a preferred series ESD protection circuit 100 is shown in FIGS. 11A-11B. In FIG. 11A, the ESD devices 100A, 100B, 100C are all disposed on a same level 500 and manufactured at the same time. Each of them (e.g. 100A) includes an OTS component (e.g. 300A). Each OTS component 300A includes an upper electrode 310, an OTS film 330 and a lower electrode 320. All OTS films 330 in the OTS components 100A, 100B, 100C have the same thickness, and are formed in a same processing step. Each ESD device (e.g. 100A) may also comprise a series resistor (e.g. 200A). The series resistor 200A is formed in a resistor via 210. Adjacent ESD devices 100A, 100B are laterally connected in series through the vertical via 220 and the horizontal interconnect 230. Here, the vertical via 220 may comprise a high-resistivity material (similar to the resistor via 210) or a low-resistivity material (similar to a conventional via).

Comprising many vias (including the resistor via 210 and the conventional via 220) and the horizontal interconnect 230, the ESD protection circuit 100 in FIG. 11A occupies a relatively large area. In order to reduce area, the embodiment in FIG. 11B uses a shared interconnect. In this embodiment, the lower electrode 320A of the ESD device 100A is directly connected with the lower electrode 320B of the ESD device 100B to form a shared interconnect 320. Similarly, the upper electrode 230B of the ESD device 100B and the upper electrode 230C of the ESD device 100C are also directly connected to form a shared interconnect. Note that, for the embodiment of FIG. 11A, the direction of current flow is same in the ESD devices 100A, 100B, 100C; on the other hand, for the embodiment of FIG. 11B, the direction of current flow is opposite in the ESD devices 100A, 100B.

Figure 12:
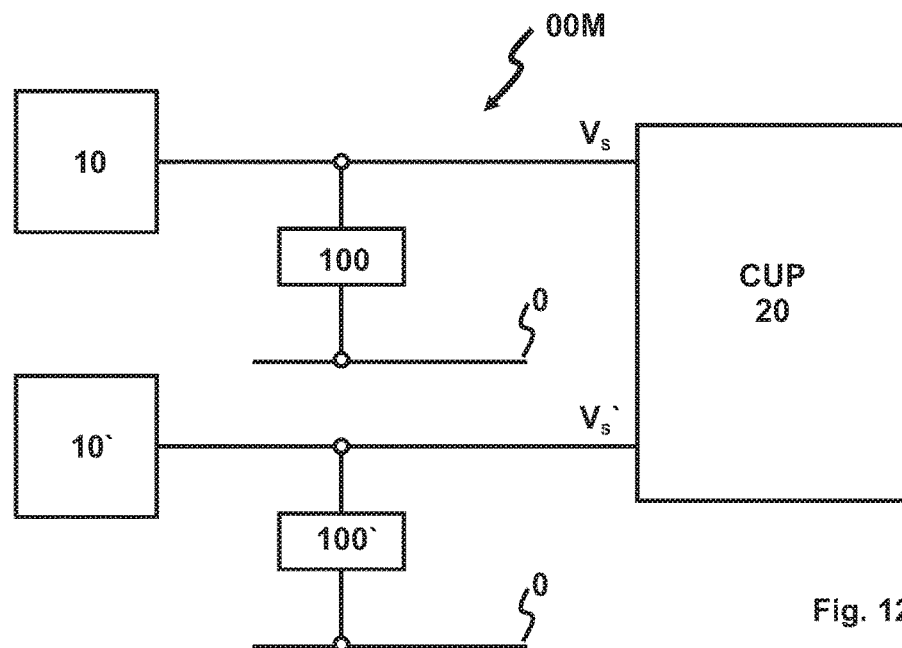
FIG. 12 is a circuit diagram of a multi-supply IC.

As shown in FIG. 12, the multi-supply IC 00M has multiply power supplies, with a first power supply Vs=1.8V coupled with a pad 10 and protected by a first ESD protection circuit 100; and, a second power supply Vs'=1.2V coupled to a pad 10' and protected by a second ESD protection circuit 100'. For the multi-supply IC 00M, prior art generally uses OTS films with different thicknesses, which require multiple processing steps and has a higher manufacturing cost.

Figure 13:
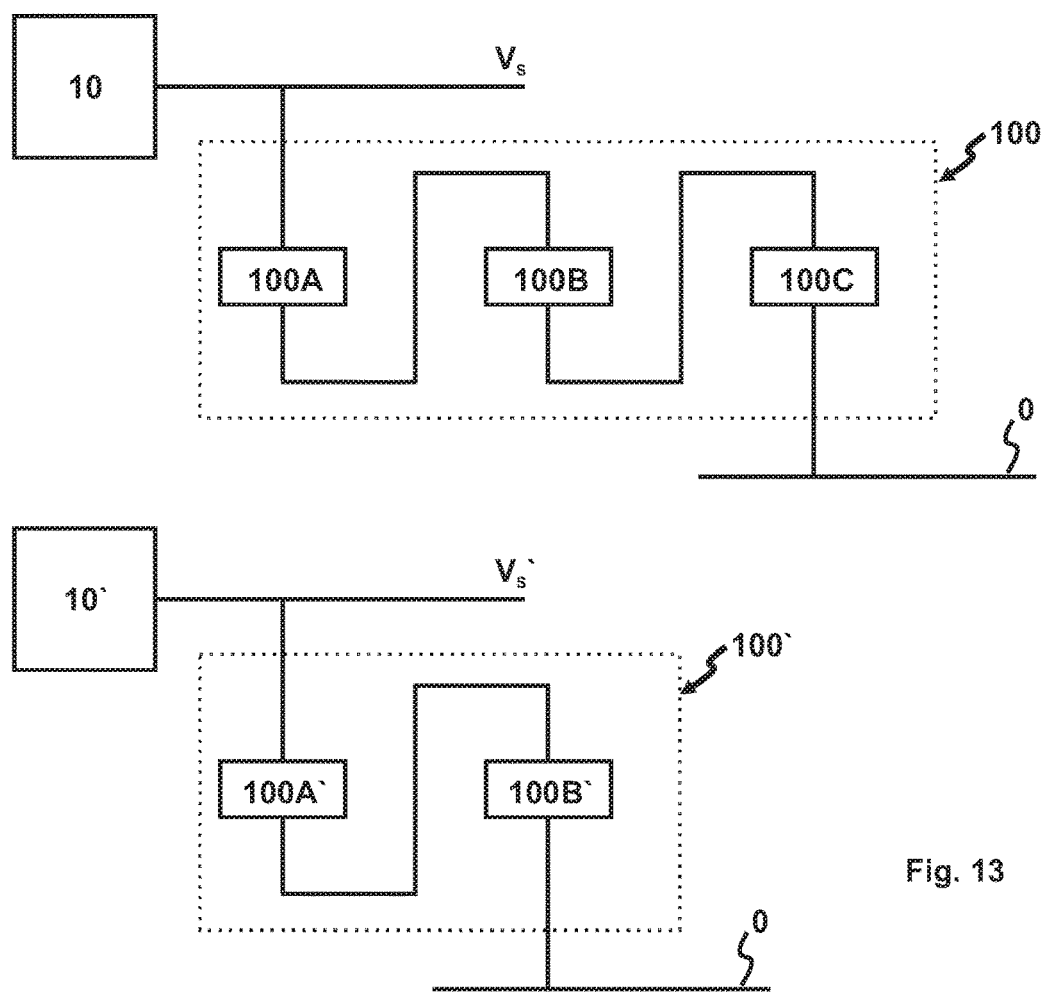
FIG. 13 is a circuit diagram of preferred series ESD protection circuits used in a multi-supply IC.

The series-connected, laterally-placed ESD devices can help to lower the ESD cost for the multi-supply IC 00M. For the preferred multi-supply IC 00M, different numbers of the ESD devices can be used to realize the ESD protection for different $V_s$'s. As illustrated in FIG. 13, for Vs=1.8V, three ESD devices 100A, 100B, 100C with $V_{th}$=0.6V each are used to provide ESD protection; for $V_s'$=1.2V, two ESD devices 100A', 100B' with $V_{th}$=0.6V each are used to provide ESD protection. All of the ESD devices 100A, 100B, 100C; 100A', 100B', have a same structure.

Figure 14:
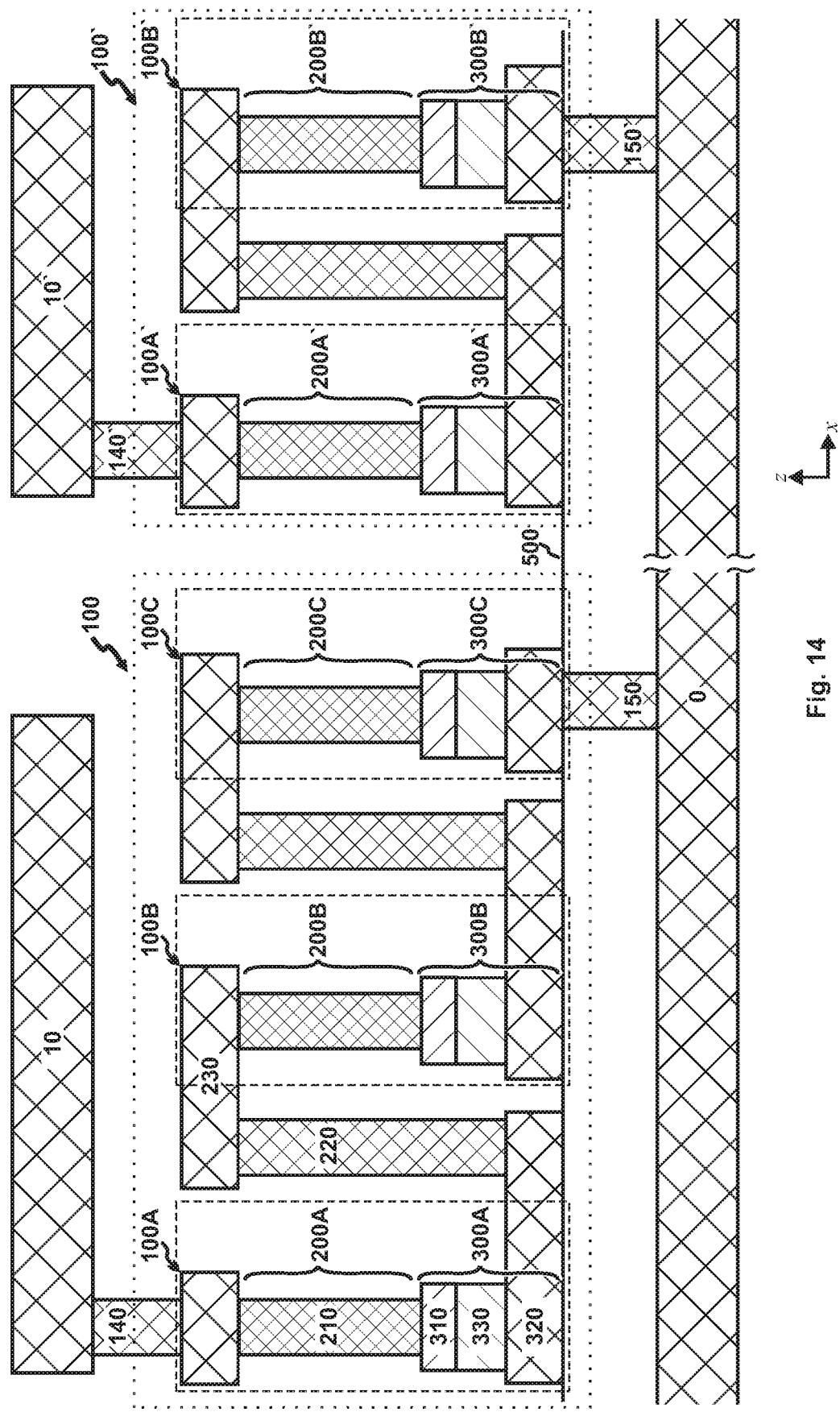
FIG. 14 is a cross-sectional view of a preferred series ESD protection circuit.

A detailed structure of the ESD protection circuits for the preferred multi-supply IC 00M is shown in FIG. 14. The ESD devices 100A, 100B, 100C in the ESD protection circuit 100 and the ESD devices 100A', 100B' in the ESD protection circuit 100' are disposed on a same level 500 and manufactured at the same time. These ESD devices contain the OTS components 300A, 300B, 300C and 300A', 300B'. The OTS films 330 in the OTS components 300A, 300B, 300C and 300A', 300B' have a same thickness and are formed in the same process step. Each ESD device (e.g. 100A) preferably comprises a series resistor (e.g. 200A). Adjacent ESD devices (such as 100A, 100B) are connected in series through the vertical via 220 and horizontal interconnect 230. In other preferred embodiments, at least one ESD device (e.g. 100A) of the ESD protection circuit 100 has a same structure as at least one ESD device (e.g. 100A') of the ESD protection circuit 100'.

To avoid thermal runaway while lowering the ESD cost for a large-supply IC, it is often necessary to combine the parallel ESD protection circuits (FIGS. 7A-9B) and the series ESD protection circuits (FIGS. 10-14). Accordingly, the present invention discloses a hybrid ESD protection circuit. It comprises at least two ESD groups, each of the ESD groups comprising a plurality of ESD devices. The preferred hybrid ESD protection circuit is in either one of two configurations:
(1) all ESD groups are connected in parallel, while the ESD devices in each ESD group are connected in series; or,
(2) all ESD groups are connected in series, while the ESD devices in each ESD group are connected in parallel.
The hybrid ESD protection circuit could be a series-parallel ESD protection circuit or a parallel-series ESD protection circuit.

Figure 15:
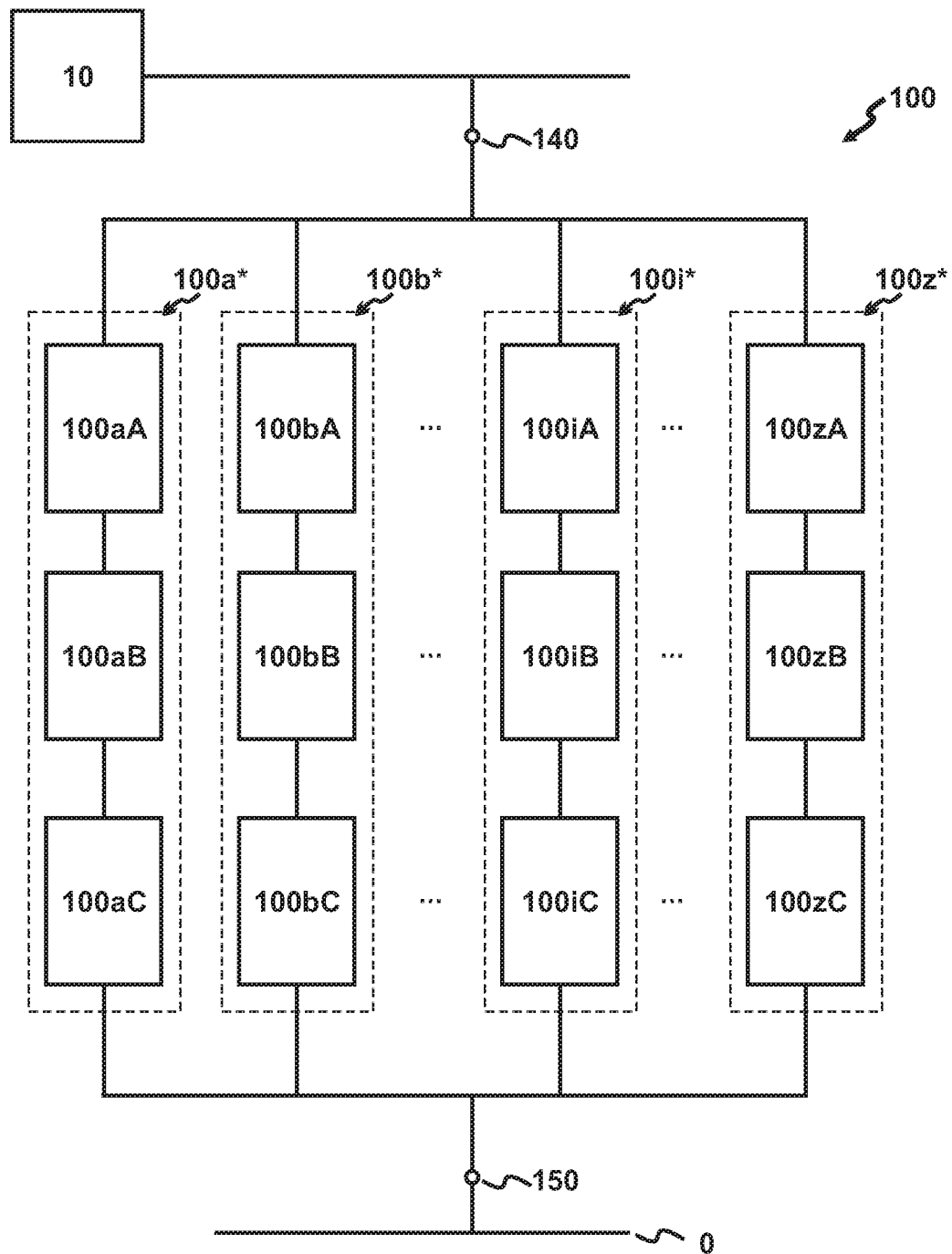
FIG. 15 is a circuit diagram of a preferred series-parallel ESD protection circuit.

FIG. 15 discloses a preferred series-parallel ESD protection circuit 100. It comprises a plurality of ESD groups 100a*, 100b* . . . 100i* . . . 100z* connected in parallel. Each ESD group (e.g. 100a*) further comprises a first plurality of the ESD devices (e.g. 100aA, 100aB, 100aC) connected in series. Each ESD device comprises an OTS component.

Figure 16:
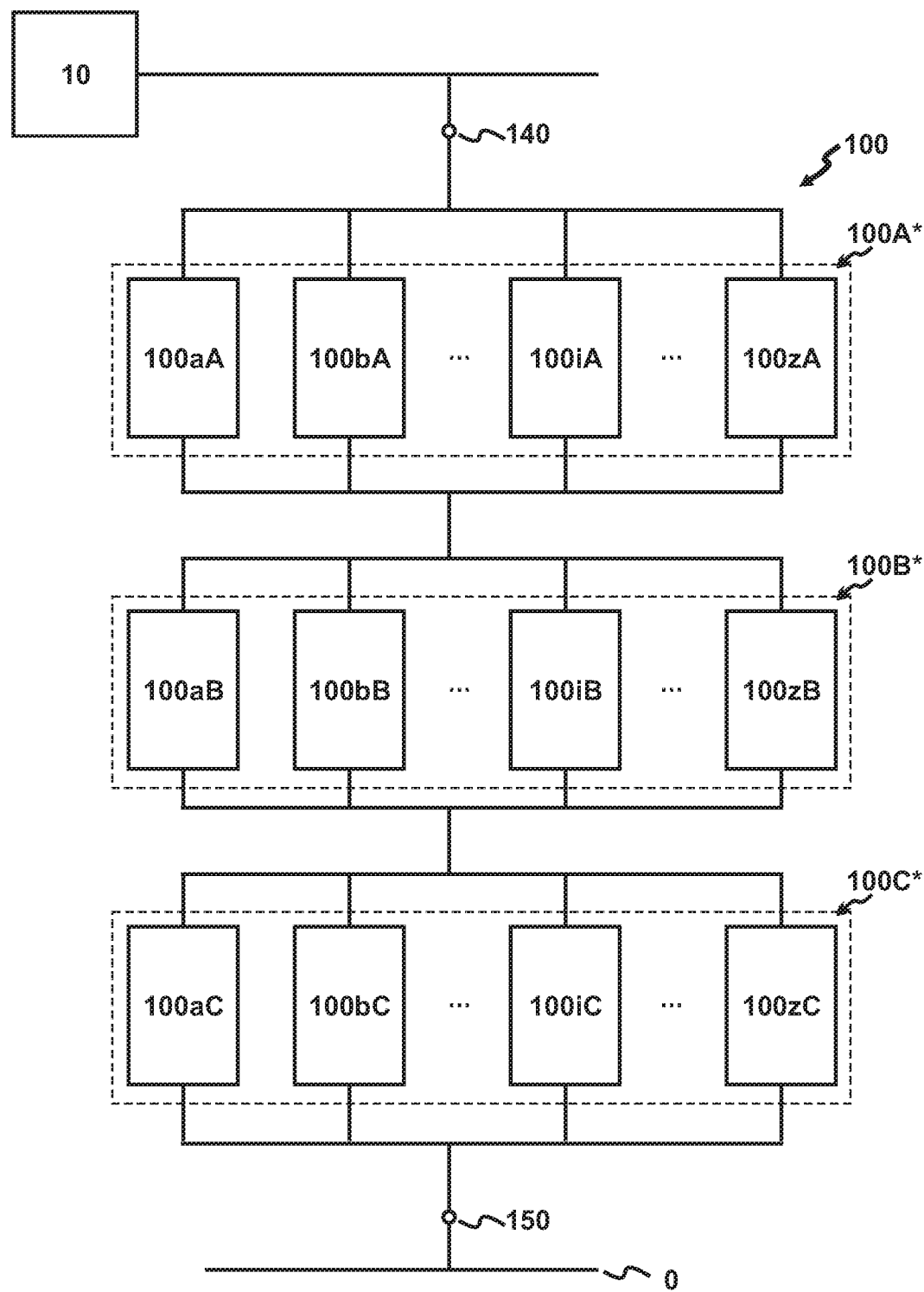
FIG. 16 is a circuit diagram of a preferred parallel-series ESD protection circuit.

FIG. 16 discloses a parallel-series ESD protection circuit 100. It comprises a plurality of ESD groups 100A*, 100B*, 100C* connected in series. Each ESD group (e.g. 100A*) further comprises a plurality of the ESD devices (e.g. 100aA, 100bA . . . 100iA . . . 100zA) connected in parallel. Each ESD device comprises an OTS component.

While illustrative embodiments have been shown and described, it would be apparent to those skilled in the art that many more modifications than that have been mentioned above are possible without departing from the inventive concepts set forth therein. The invention, therefore, is not to be limited except in the spirit of the appended claims.

What is claimed is:

1. An ESD protection circuit for protecting a pad, including a plurality of ESD devices connected in parallel between said pad and a power supply, each of said ESD devices comprising:
   a resistor disposed in a resistor via, wherein said resistor via is a vertical via formed in an inter-layer dielectric and filled with at least a conductive material with a high resistivity;
   a two-terminal switch disposed vertically with said resistor, wherein said two-terminal switch is turned on when a voltage between said two terminals is above a threshold voltage ($V_{th}$);
   wherein said resistor and said two-terminal switch in said each of said ESD devices are connected in series, and the voltage drop on said resistor at an ESD event is larger than the standard deviation of $V_{th}$ of all two-terminal switches.

2. An ESD protection circuit for protecting first and second pads, comprising:
   m (m≥2) ESD devices connected in series between said first pad and a power supply, comprising first and second ESD devices, wherein said first ESD device includes a first two-terminal switch and is turned on when a first voltage on said first two-terminal switch is above a first threshold voltage; and, said second ESD device includes a second two-terminal switch and is turned on when a second voltage on said second two-terminal switch is above a second threshold voltage;
   n (n≥1) ESD devices connected in series between said second pad and said power supply, comprising a third ESD device, wherein said third ESD device includes a third two-terminal switch and is turned on when a third voltage on said third two-terminal switch is above a third threshold voltage;
   wherein said first, second and third two-terminal switches are disposed on a same level and have a same thickness; and, m≠n.

3. The ESD protection circuit according to claim 2, wherein said third two-terminal switch includes an OTS (Ovonic threshold switch) component.

4. The ESD protection circuit according to claim 3, wherein said OTS component comprises at least a chalcogen element.

* * * * *